United States Patent [19]
Ball et al.

[11] 4,339,870
[45] Jul. 20, 1982

[54] SERIES-CONNECTED TWO-TERMINAL SEMICONDUCTOR DEVICES AND THEIR FABRICATION

[75] Inventors: Geoffrey Ball, Sandy; Harry A. Deadman, Clifton Shefford; John G. Smith, Biggleswade; John C. Vokes, Harpenden, all of England

[73] Assignee: The Secretary of State for Defence in Her Britannic Majesty's Government of the United Kingdom of Great Britain and Northern Ireland, London, England

[21] Appl. No.: 206,680

[22] Filed: Nov. 13, 1980

[30] Foreign Application Priority Data

Nov. 15, 1979 [GB] United Kingdom ................ 7939564

[51] Int. Cl.³ ................. H01L 21/265; H01L 21/283; H01L 21/308
[52] U.S. Cl. .................................... 29/576 B; 29/580; 29/590; 29/591; 156/628; 156/629; 156/631; 156/632; 156/633; 156/649; 156/654; 156/657; 156/662; 357/56; 357/68; 357/76
[58] Field of Search ............... 156/629, 630, 633, 634, 156/628, 657, 649, 632, 662, 654; 29/591, 590, 576 W, 576 B, 580; 357/56, 71, 68, 75, 76

[56] References Cited

U.S. PATENT DOCUMENTS

| | | | |
|---|---|---|---|
| 3,489,961 | 1/1970 | Frecura et al. | 357/49 |
| 3,649,881 | 3/1972 | Chang et al. | 357/76 |
| 3,721,593 | 3/1973 | Hays et al. | 156/628 |
| 3,773,566 | 11/1973 | Tsuchimoto | 29/576 B |
| 3,902,095 | 8/1975 | Bierig et al. | 29/580 |
| 3,903,590 | 9/1975 | Yokogawa | 29/591 |
| 3,930,912 | 1/1976 | Wisbey | 156/657 |
| 3,959,045 | 5/1976 | Antypas | 156/630 |
| 3,979,820 | 9/1976 | Anthony et al. | 29/590 |
| 3,986,196 | 10/1976 | Decker | 357/72 |
| 4,106,052 | 8/1978 | Schierz | 357/72 |
| 4,189,342 | 2/1980 | Kock | 156/649 |
| 4,241,360 | 12/1980 | Hambor et al. | 357/56 |

FOREIGN PATENT DOCUMENTS

| | | |
|---|---|---|
| 2023722 | 8/1970 | France. |
| 2373879 | 7/1978 | France. |
| 2004416 | 3/1979 | United Kingdom. |

OTHER PUBLICATIONS

Blum et al., "Method . . . Circuits", IBM Technical Disclosure Bulletin, vol. 21, No. 9 (2/79), pp. 3814-3817.

Primary Examiner—Jerome W. Massie
Attorney, Agent, or Firm—Cushman, Darby & Cushman

[57] ABSTRACT

A method of fabricating a series-connected combination of two-terminal semiconductor devices on a common substrate comprising: forming a layer of high quality semiconductor material, 4, on the surface of a temporary substrate, 2 and 3, to provide active areas for the devices, forming first contact pattern conductors, 6, 9, 10, on the free surface of the high quality semiconductor layer to provide a separate first contact to this layer for each of the devices, bonding an insulating support substrate, 12, to the first contact pattern, removing the temporary substrate, forming second contact pattern conductors, 17, 18, 19, on the other surface of the high quality layer to provide a separate second contact to this layer for each of the devices, removing regions, 8, of the high quality layer separating the conductors of a pattern at any stage after beginning formation of the first contact pattern in order to define the device active areas so that parts of the first contact pattern are exposed when both the temporary substrate and the regions of the high quality layer have been removed, and providing interconnections between the exposed parts, 10, of the first contact pattern and parts of the second contact pattern, whereby to connect the devices in series.

Also any series-connected combination of two-terminal semiconductor devices fabricated according to the inventive method.

14 Claims, 11 Drawing Figures

SERIES-CONNECTED TWO-TERMINAL SEMICONDUCTOR DEVICES AND THEIR FABRICATION

BACKGROUND OF THE INVENTION

This invention relates to series-connected combinations of two-terminal semiconductor devices, such as microwave diodes, and to methods of fabricating such combinations on a common substrate.

It is well known that the amount of power that can be obtained from a microwave diode whether operating in the avalanche effect or transferred electron effect mode, is determined by the active area of the device—the greater this area, the more power obtainable. However, as the active area of the device is increased to obtain increased power, the capacitance of the device also increases, and this in turn causes a reduction in the impedance of the device, which varies inversely with the capacitance. If the impedance of the device becomes too small, difficulties arise in matching it with the impedance of associated circuitry, and to overcome this difficulty, it is known to connect a number of individual devices together in series to obtain the required power while maintaining an acceptable value of impedance for the combination.

Hitherto this has usually been done by connecting together a number of individually packaged devices resulting in a relatively bulky combination, and requiring individual interconnections between the devices to be carried out manually, e.g. by soldering or welding.

It is an object of the present invention to provide means whereby the above-mentioned disadvantages may be overcome or at least substantially reduced.

According to a first aspect of the present invention a method of fabricating a series-connected combination of two-terminal semiconductor devices on a common substrate comprises:

forming a layer of high quality semi-conductor material on the surface of a temporary substrate to provide active areas for the devices;

forming first contact pattern conductors on the free surface of the high quality semiconductor layer to provide a separate first contact to this layer for each of the devices;

bonding an insulating support substrate to the first contact pattern;

removing the temporary substrate;

forming second contact pattern conductors on the other surface of the high quality layer to provide a separate second contact to this layer for each of the devices;

removing regions of the high quality layer separating the conductors of a pattern at any stage after beginning formation of the first contact pattern in order to define the device active areas so that parts of the first contact pattern are exposed when both the temporary substrate and the regions of the high quality layer have been removed, and providing interconnections between the exposed parts of the first contact pattern and parts of the second contact pattern, whereby to connect the devices together in series.

Preferably the support substrate according to the first aspect of this invention is formed on its surface with a metallic pattern to which the first contact pattern is bonded before removal of the temporary substrate.

In the method according to the first aspect of the invention, the first contact pattern is preferably formed in two stages, the first stage providing discrete contacts for each of the devices defining the active area thereof, and the individual active regions of the device then being isolated from one another by exposing the active layer to an ion beam using these contacts as a mask to create areas of semi-insulating material in the active layer surrounding each of the device active regions underlying the contacts. The second stage of the formation of the first contact pattern then comprises formation of a contact pad portion for each of the device first contacts which are to be interconnected with a device second contact, each of these contact pad portions overlying at least part of the associated first contact, and an adjacent area of the ion beam isolated region of the active layer. Either following removal of the temporary substrate, or before carrying out the second stage in the formation of the first contact pattern, preferably the latter, part of the ion beam isolated region of the active layer over which the contact pad portions are formed, is removed, to enable the interconnections between the contact patterns on opposite sides of the active layer to be made following removal of the temporary substrate, the removed parts of the active layer being isolated from the device active regions.

Alternatively, the isolation of the device active regions may be performed after removal of the temporary substrate, these regions being defined by the second contact pattern which is thus used as a mask for the isolation process. The interconnections between the contact pad portions associated with the device first contacts and the contacts of the second contact pattern are formed by an additional metallization pattern.

According to a second aspect of the present invention a method of fabricating a series-connected combination of two-terminal semiconductor devices on a common substrate comprises:

fabricating a first precursor by the following procedure:

forming a layer of high quality semiconductor material on the surface of a temporary substrate, forming first contact pattern conductors on the free surface of the high quality semiconductor layer to provide a separate first contact to this layer for the devices thereon, bonding an insulating support substrate overlayed by a conducting interconnection pattern to the first contact pattern so as to provide contact between the first and the interconnection patterns, removing the temporary substrate, forming second contact pattern conductors on the other surface of the high quality layer to provide a separate second contact to this layer for the devices thereon, removing part of the high quality layer to form isolated regions in the high quality semiconductor material sandwiched between the first and second contact patterns, fabricating a second precursor by the same procedure as that used for the first precursor, bonding the first and second precursors together so as to provide contact between the second contact pattern of the one and the interconnection contact pattern of the other.

The isolated regions of high quality semiconductor material are preferably formed according to the second aspect of the invention by removing the surrounding semiconductor material by etching. The etching may be performed immediately prior to or after formation of the first contact pattern by creating mesas in the high quality layer or alternatively immediately prior to formation of the second contact pattern instead of after the second contact pattern formation. However, if etching is performed with a contact pattern present on the free surface of the high quality layer, this pattern may advantageously serve as an etch mask.

In order to achieve good uniformity of device characteristics, the high quality semiconductor material of both precursors according to the second aspect of the invention are preferably formed in a single step which produces a single layer, this layer then being scribed and broken into parts for each precursor.

According to a preferred method in accordance with both aspects of the invention, the high quality layer is formed of active semiconductor material having suitable semiconductor properties capable of supporting device operation and the support substrate is formed of an electrically insulating material having a high thermal conductivity.

Preferably at least the region of the temporary substrate immediately adjacent to the high quality layer according to both aspects of the invention is removed by selective etching using an etchant to which the high quality layer is resistant. Conveniently, the substrate may comprise a first relatively thick layer of semiconductor material formed on its surface with a relatively thin buffer layer of semiconductor material on which the high quality active layer is formed, e.g. by epitaxial growth, the relatively thick substrate layer then preferably being removed by a selective etching procedure to which the buffer layer is resistant, followed by removal of the buffer layer using a second selective etching procedure to which the high quality layer is resistant.

Such a two-layer temporary substrate may comprise a relatively thick layer of GaAs and a thin epitaxial buffer layer of GaAlAs with a high quality semiconductor layer of GaAs. Alternatively, the high quality layer may be of another semiconductor material, such as silicon, epitaxially formed on a temporary substrate having a suitable selectively etchable single or multilayer structure.

The invention enables a number of individual two-terminal devices, such as microwave diodes, to be connected together in series at chip-level, i.e. in a single integrated circuit, resulting in a considerable reduction in size and in the spacing between adjacent devices providing advantages at high frequencies. The invention also avoids the need for individual packaging of the devices thereby avoiding parasitics associated with such packaging, and the reliability of the interconnections between the devices can be improved as the devices do not need to be individually bonded as in conventional series-connected arrangements. Further, because all the devices of the series combination can be formed from the same active layer, and more importantly from closely adjacent areas of the same active layer, greater diode uniformity is achieved, and increased yields can be obtained.

BRIEF DESCRIPTION OF THE DRAWINGS

The invention also extends to series connected combinations of two terminal devices fabricated by a method as aforesaid.

The invention will now be described in greater detail, by way of example only, with reference to the accompanying drawings, of which.

DESCRIPTION OF THE PREFERRED EMBODIMENT

Figure 1:
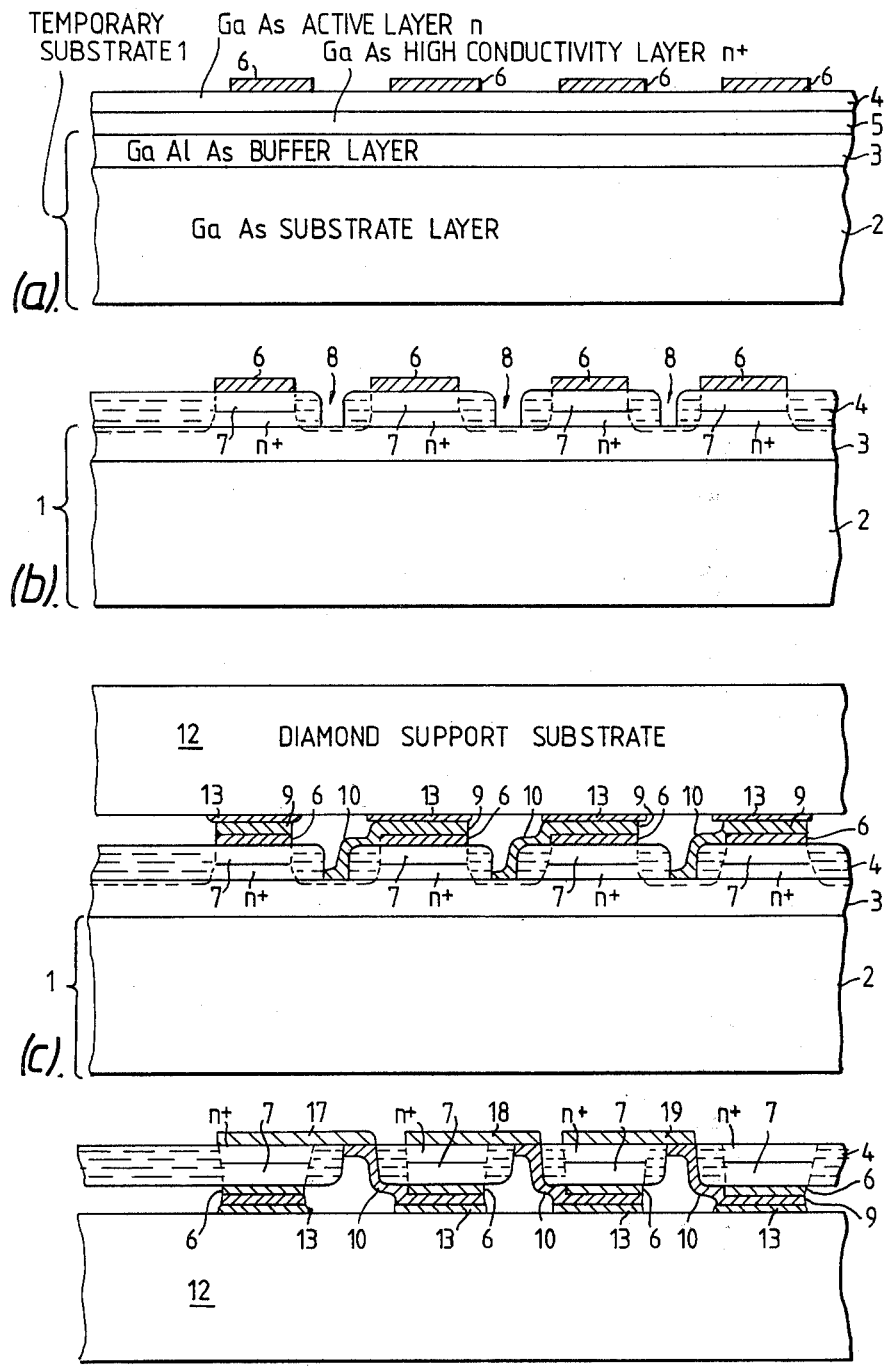
FIGS. 1(a) to 1(d) show in schematic cross-sectional elevation, four stages in the fabrication of a series-connected combination of microwave GaAs Impatt diodes in accordance with the first aspect of the present invention.

Referring to FIG. 1, the method illustrated comprises epitaxially growing a high conductivity n+ layer 5 approximately 1 micron thick and having a dopant concentration of about $1 \times 10^{18}$ carriers/cm$^3$ on the surface of a temporary substrate 1 comprising a relatively thick (typically several hundred microns) layer 2 of GaAs formed with an epitaxially buffer layer 3 of GaAlAs having a thickness of about 0.5 to 2 microns. An active layer 4 of n-type GaAs, capable of supporting Impatt device operation, is then epitaxially grown on the surface of the n+ layer 5, the active layer having a thickness of about 1 micron and a dopant concentration of about $1 \times 10^{17}$ carriers/cm$^3$. The above parameters are suitable for Impatt device operation at about 50 to 60 GHz. Because the temporary substrate 1 forms no part of the completed device, and because the relatively thick GaAs layer thereof is isolated from the layers 4 and 5 by the buffer layer 3, its electrical properties are unimportant. The GaAs layer of the substrate may thus be of any suitable conductivity type, e.g. n,p or semi-insulating (SI).

Following formation of the active layer 4, a number (4 in this example) of Schottky barrier contacts 6, one more than the number of devices of the required series-connected combination, are formed on the free surface of the active layer 4, defining the active area of each device. The contacts 6 are formed by initially applying a sputtered or evaporated metallization pattern, suitably of Ti/Au, which is then electrolytically plated with a 1 to 2 micron thick layer of Au (FIG. 1(a)). The size of each contact is typically about 50×20 microns.

These contacts, which provide the first of the two device terminals are then used as a mask in an ion beam isolation process in which the slice is irradiated with a beam of high energy protons to convert all regions of the layers 4 and 5 which are not covered by the contacts 6, into semi-insulating form. The energy of the proton beam is progressively increased in a known manner, in 100 keV intervals until the penetration depth extends just into the underlying buffer layer 3, thus ensuring that the exposed regions of the active layer 4 and underlying portions of the n+ layer 5 are isolated throughout their thickness. The process results in a separate active region 7 of n-type GaAs underlying each of the Schottky contacts 6 surrounded by proton isolated semi-insulating GaAs material.

Following the isolation of the active device regions 7, part of the proton-isolated layers 4 and 5 is removed using a photolithographically formed resist mask to define holes 8 extending through to the underlying buffer layer 3, one between each pair of contacts 6, but separated therefrom by a region of the proton-isolated active layer. These holes are formed using a selective etchant, for example a 95.5 mixture of 100V $H_2O_2$ and 35% $NH_4OH$, which will automatically stop at the interface between the layer 5 and the underlying GaAlAs buffer layer 3 which is resistant to this etchant; as shown in FIG. 1(b).

A second metallization pattern is then formed to connect respective ones of the three of the four Schottky contacts 6 to the adjacent one of the holes 8. The pattern thus comprises a separate area 9 overlying each of the contacts 6, which, in the case of the three contacts 6 which are to be connected with one of the holes 8, also extends into a contact pad portion 10 overlying the adjacent hole 8 to one side of the associated contact 6 as shown in FIG. 1(c). This second metallization stage is again formed by first applying an evaporated or sputtered metallization pattern of, for example, Ti/Au, which is then electrolytically plated-up with Au to a thickness of about 1 to 2 microns.

The next stage in the process comprises bonding an insulting support substrate 12 of high thermal conductivity material to the elevated metallization areas 9. As shown, the support substrate 12 comprises a diamond chip (commercially available Type IIa diamond chips are preferred) having the desired insulating and high thermal conductivity properties. To facilitate the bonding process, the surface of the diamond chip 12 is formed with an evaporated or sputtered metallization pattern 13, e.g. of Ti/Au or Cr/Au corresponding to that of the contacts 6. The metallization pattern 13 on the diamond substrate 12 is aligned with the elevated metallization areas 9 on the semiconductor structure, and the two are then bonded together in known manner, suitably using a thermo-compression bonding technique. The device at this stage is shown in FIG. 1(c).

Having affixed the semiconductor structure to the support substrate, the temporary substrate 1 is then removed using a two-stage selective etching process. The first stage comprises removal of the thick GaAs layer 2 using an etchant to which the GaAlAs buffer layer is resistant, and the active layer 4 being suitably protected. A suitable etchant is a 95.5 mixture of 100V $H_2O_2$ and 35% $NH_4OH$, which will automatically stop at the interface between the GaAs layer 2 and the GaAlAs buffer layer 3. The thin buffer layer 3 is then removed using a selective etchant to which the layer 5 is resistant, suitably a 50% solution of HF in water. This etch can thus be made to automatically stop at the interface between the GaAlAs buffer layer 3 and the GaAs n+ layer 5, to leave a thin highly uniform epitaxially formed layer of GaAs supported by the support substrate 12, and exposing those areas of the contact pad portions 10 previously formed on the other side of the active layer 4 which overlay the holes 8 formed in the proton isolated regions of the active layer.

A surface thickness of the epitaxial GaAs layer immediately underlying the GaAlAs buffer layer 3, which in this example comprises the surface of the n+ GaAs layer 5, may then be removed to reduce this layer to any desired thickness, and to remove any surface impurities. This step may be of greater importance in devices in which the GaAlAs buffer layer is interfaced directly with the epitaxial active layer 4, i.e. where the n+ layer 5 is omitted, or is formed on the opposite side of layer 4.

A further metallization pattern, again conveniently formed by initially applying on evaporated or sputtered pattern of Ti/Au which is then plated-up to a thickness of about 1 to 2 microns, is then formed on the free surface of the semiconductor structure to complete the series interconnection of three of the four devices of the combination while also providing the second contact terminal for each of these three devices. This pattern thus comprises three separate areas 17, 18, 19, the first of these, 17, is formed in contact with the surface of the n+ region of the first device at one end (as shown in FIG. 1(c), at the left hand end) of the series and also with the area of the contact pad portion 10 of the second device of the series which is exposed through the hole 8 between the first and second devices. This metallization area thus provides an interconnection between the low-impedance second contact terminal of the first device and the Schottky barrier first contact terminal 6 of the second device.

Similarly the second metallization area 18 provides the low resistance second contact terminal for the second device of the series, and provides an interconnection between this contact terminal and the Schottky barrier first contact 6 of the third device of the series via the contact pad 10 associated with this contact 6. Finally, the third metallization area 19 provides the low resistance second contact terminal for the third device of the series and serves to provide an interconnection between this contact terminal and the Schottky barrier contact 6 of the fourth unused device structure of the series. In fact, this fourth device structure forms no operational part of the completed device combination, and is formed solely to enable the external connection to be made to this end of the completed combination at the surface of the diamond support substrate rather than directly to the low impedance second contact terminal 19 of the third device of the series. This is because bonding directly to contact terminals supported directly on the thin semiconductor layer in which the devices are formed may damage or harmfully affect the properties of this layer.

Figure 2:
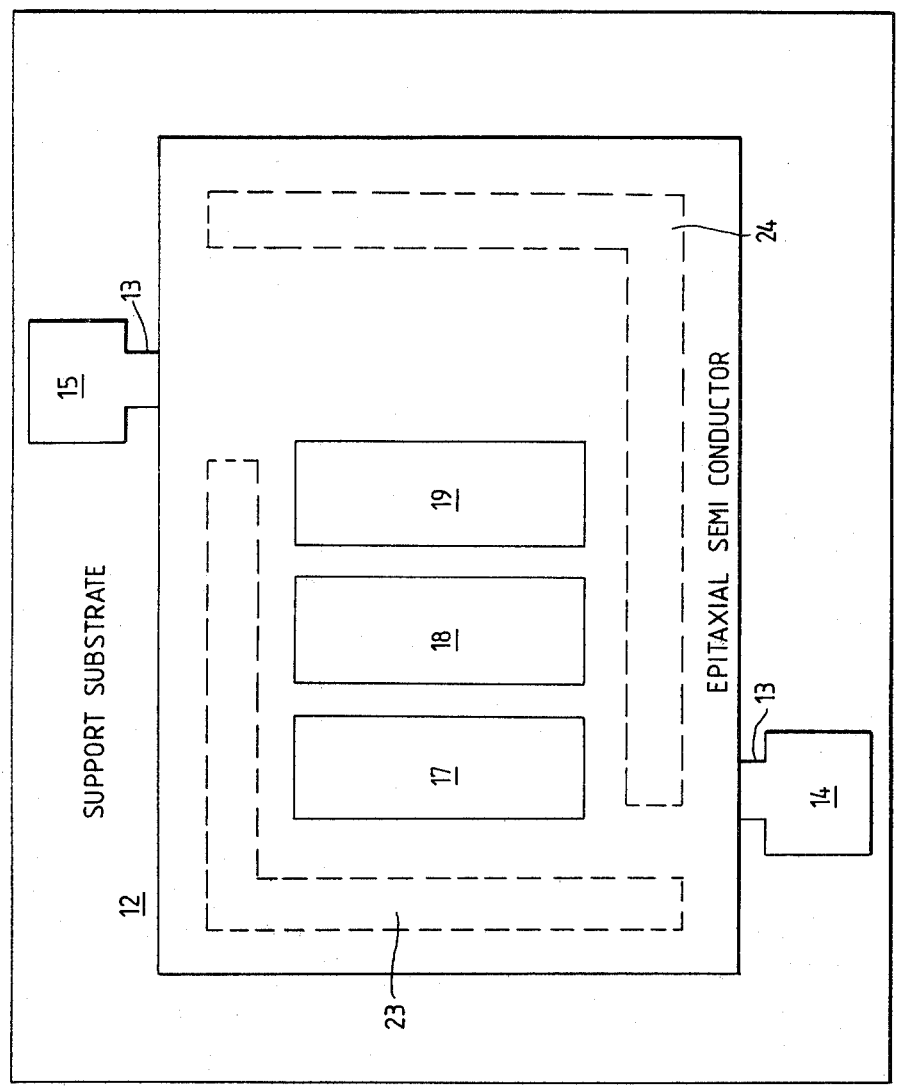
FIG. 2 is a schematic plan view of the series-connected combination of microwave diodes of FIG. 1.

To provide contact areas for external connection to each end of the series combination, the two outer contact areas of the metallization pattern 13 on the diamond substrate 12 are elongated and enlarged at one end so as to extend beyond the lateral edges of the semiconductor body containing the active devices, as shown in FIG. 2, to provide contact pads 14, 15.

It will be noted that although the three metallization areas 17, 18, 19 which provide the low impedance second contacts of the devices are formed in the same manner as Schottky barrier contacts, they are in fact forward-biased in operation and thus perform as low-impedance contacts. The presence of the n+ high conductivity layer 5 through which the low-resistance contact is made to each device, is optional, but is preferably included to further reduce the impedance of these contacts.

Figure 3:
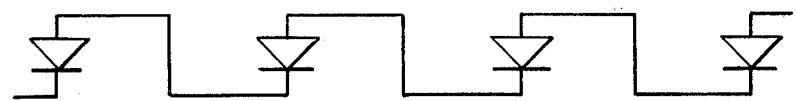
FIG. 3 is a symbolic representation of the diode combination of FIG. 1(d).

FIG. 3 shows symbolically, the diode combination of FIG. 1(d).

To improve the mechanical stability of the thin GaAs device structure on the support substrate 12 additional L-shaped metallization areas 23,24 (FIG. 2) may be provided on their facing surfaces prior to bonding. These metallization areas may conveniently be formed during the same metallization steps used to form the Shottky contacts 6 and contact pads 10 on the surface of the active layer 4, and the metallization pattern 13 on the cooperating surface of the diamond substrate 12, and are then bonded together during the thermocompression bonding of the semiconductor structure to the diamond support substrate.

Figure 4A:
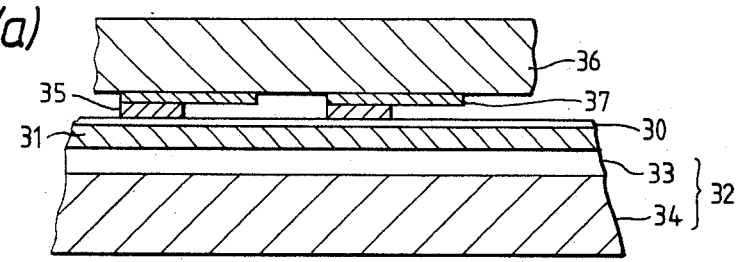
FIGS. 4(a) to 4(d) show in schematic cross-sectional elevation, four stages in the fabrication of a series-connected combination of diodes in accordance with a second aspect of the invention.
Figure 4B:
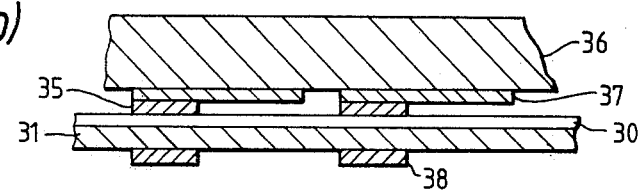
Figure 4C:
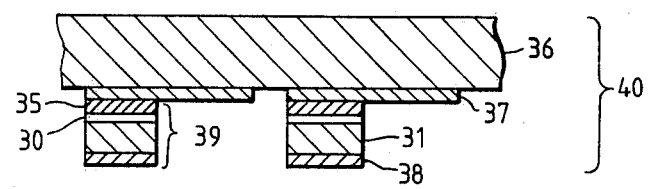

In FIG. 4 the method illustrated comprises epitaxially growing a high conductivity n+ layer, 30 in FIG. 4(a), on the surface of high quality active layer, 31, of n-type GaAs capable of supporting diode operation. The active layer is supported on a temporary substrate, 32, consisting of a thin epitaxial buffer layer, 33, of GaAlAs supported on a relatively thick layer, 34, of GaAs. A number of ohmic contacts, 35, (two are illustrated in FIG. 4(a)) are formed on the layer, 30, and constitute the first of the two device terminals. An insulating support substrate, 36, of high thermal conductivity (diamond in this example) and overlaid on its surface by interconnection metallization areas, 37, which correspond with the contacts, 35, is bonded to the n+ layer so that the areas, 37, and the contacts, 35, are sealed together.

The temporary substrate layers, 34 and 33, are then removed using a selective etch technique as outlined for the diode combination of FIGS. 1 and 2 and the active layer, 31, is then etched to give the required thickness. This is followed by formation of Schottky barrier contacts, 38, (FIG. 4(b)) on the resulting free surface of the active layer opposite the contacts, 35, the contacts, 38, constituting the second of the two device terminals. The layers 30 and 31 are then etched to give isolated regions, 39, (FIG. 4(c)) sandwiched between the first and second device terminals, the resulting structure, 40, forming a first precursor for the final diode combination. A second precursor, 41, (FIG. 4(d)) having the same construction as the first precursor, 40, except that it includes an additional metallization area, 42, is then introduced and bonded to the first precursor so that consecutive metallization areas, 37, of the first precursor are sealed to consecutive second terminals, 38, of the second precursor and consecutive second terminals, 38, of the first precursor are sealed to consecutive metallization areas, 37, of the second precursor.

Figure 4D:
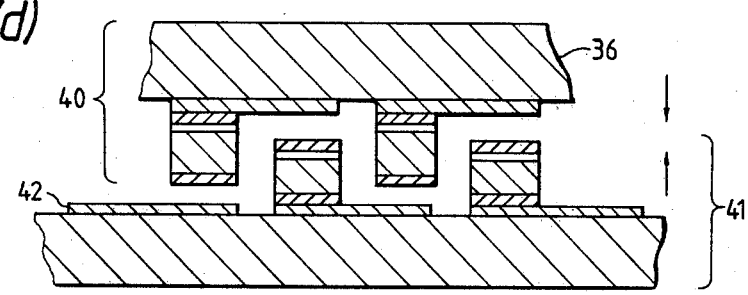
Figure 5:
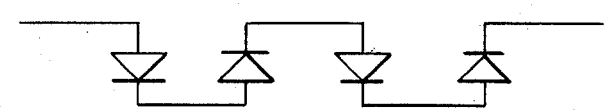
FIG. 5 is a symbolic representation of the diode combination of FIG. 4(d).

FIG. 5 is the electrical representation of the completed device of FIG. 4(d).

A variation on the above method according to the second aspect of the invention would be to etch mesas into the layers 30 and 31 before formation of the Schottky barrier contacts, 35, instead of etching the layers to give isolated regions after formation of the contacts, 38. Alternatively isolated regions may be etched into layers 30 and 31 after removal of the temporary substrate, 32, and before formation of the contacts, 38.

Some of the advantages of the method according to the second aspect of the invention over the method according to the first aspect of the invention are, firstly, that there is less stray capacity associated with the interconnection metallization as the proton-isolated GaAs is replaced by air. Secondly, no proton isolation is required. This results in one less major step in the fabrication procedure of GaAs devices and allows the possibility of series connection of diodes fabricated from semiconductors which cannot be electrically isolated by this method. Thirdly, the completed diode combination is more compact as the interconnection metallization are planar as opposed to inter-level. Planar metallization also avoid the problems associated with inter-level connections over mesa edges formed by orientation-selective etchants which leave elevated sections with inwardly sloping edges. Fourthly, the design readily lends itself to heat sinking from both sides of the active layers.

Although the invention has been described in its application to the fabrication of four series-connected diodes, it may equally be applied to the fabrication of any number of series-connected two-terminal semiconductor devices of other types, using GaAs or other suitable materials for which selective etching processes are known such as InP or Si.

For example, in the application of the invention to Si devices, the high quality semiconductor layer providing the device active regions may be epitaxially grown on a temporary Si substrate which is selectively etchable against the active layer. The temporary silicon substrate may advantageously comprise a two layer structure consisting of a relatively thick first layer and a relatively thin epitaxial second layer on which the active layer is grown. If the first layer is of a different conductivity type, or has a different dopant concentration to the first layer than it may be selectively chemically or electrochemically etched against the second layer. Similarly, if the second layer is of different conductivity type, or has a different dopant concentration to the adjacent active layer, then it may also be selectively etched away against the active layer using a chemical or electrochemical etching process. By providing a relatively thin second, or buffer, layer on the temporary Si substrate against the active layer, very thin active layers of high uniformity can be achieved. Suitable chemical and electrochemical etching techniques are described in Theunissem et al "Application of Preferential Electrochemical Etching of Silicon to Semiconductor Device Technology" J. Electrochem. Society, Electrochemical Technology, Vol. 117, No. 7, July 1970, pages 959 to 965, in C. P. Wen et al "Preferential Electrochemical Etching of P Silicon in an Aqueous HF—$H_2SO_4$ Electrolyte" J. Electrochem. Soc. Vol 119, April 1972, No. 4 pp. 547–478; in C. J. Rhee et al "Integral Heat - Sink Impatt Diodes Fabricated using P+ Etch Stop". Proc. IEEE Vol. 61, No. 3 p. 385–387 March 1973; and in V. Kern "Chemical Etching of Si, Ge, GaAs and GaP". RCA Review June 1978, Vol. 39, pages 278 to 308.

Of course, in devices in which at least one of the two terminal contacts must be provided by a rectifying junction, this may be provided by a Schottky barrier junction, or, where this is not possible or undesirable, other forms of rectifying junction contacts may alternatively be used.

Furthermore, other modifications to the particular fabrication procedure described above may be made without departing from the scope of the present invention. For example, the active layer of high quality semiconductor material in which the device active regions are provided may be initially formed of high-resistivity or semi-insulating semiconductor material, and the individual device active regions then defined by selective doping of this layer, enabling different dopants and different carrier concentrations to be used in each device.

Whichever method is used to isolate the active regions of the devices, it may be carried out either before or after removal of the temporary substrate, i.e. from either side of the semiconductor layer in which the active regions are formed. Similarly, formation of the holes 8 in the procedure according to FIG. 1 through this layer may be performed either before or after removal of the temporary substrate, and either before or after the active regions have been defined.

In the application of the invention to avalanche effect devices, in which one of the two contacts of each device is a reverse-biased rectifying junction contact, e.g. reverse-biased Schottky barrier contact as in the described embodiment, and the other is a low resistance contact, the reverse-biased rectifying junction contacts may be provided on either side of the active layer. The reverse-biased rectifying Schottky barrier contacts may be formed first before removal of the temporary substrate, or alternatively, the low-resistance contacts may be formed first on the surface of the epitaxial layer opposite the temporary substrate, the active rectifying junction contacts then being formed after removal of the temporary substrate. Whichever arrangement is selected, the resistance of the low-resistance contacts may be improved in a known manner, as in the described embodiment, by forming them through a thin, high conductivity (n+) surface region provided either by doping the surface of the active layer to which contact is to be made, or by separately growing the required high conductivity layer at an appropriate stage in the process. Similarly, in the case of transferred electron effect devices, such as Gunn Diodes, in which both contacts of each device are low-impedance contacts, the quality of the contacts may also be improved by the formation of thin, high conductivity surface regions on one or both sides of the active layer before formation of the contacts.

What is claimed is:

1. A method of fabricating a series-connected combination of two-terminal semiconductor devices on a common substrate comprising the steps of:
   forming a layer of high quality semiconductor material on the surface of a temporary substrate to provide active areas for the devices the layer having a first free surface not in contact with the temporary substrate,
   forming first contact pattern conductors on the free surface of said high quality semiconductor layer to provide a separate first contact to this layer for each of the devices,
   bonding an insulating support substrate to said first contact pattern,
   removing said temporary substrate to expose a second surface of the high quality semiconductor material,
   forming second contact pattern conductors on the second surface of said high quality layer to provide a separate second contact to this layer for each of the devices,
   removing regions of the high quality layer separating the conductors of one of said patterns at any step of the method after beginning formation of said first contact pattern thereby defining said device active areas and exposing parts of said first contact pattern when both the temporary substrate and said regions of the high quality layer have been removed such that both said first and said second contacts are accessable from the same side of said devices, and
   providing interconnections between the exposed parts of said first contact pattern and parts of said second contact pattern, whereby to connect the devices in series.

2. A method as in claim 1 further comprising before the step of bonding said insulating support substrate to said first contact pattern, the step of forming a metallic pattern on the surface of said support for bonding to said first contact pattern.

3. A method as in claim 1 further comprising before the step of removing said regions of the high quality layer separating one of said pattern conductors, isolating the devices from each other by rendering semi-insulating said regions of high quality layer separating said device active areas.

4. A method as in claim 3 wherein said first contact pattern conductors are formed in two stages, the first stage comprising formation of discrete contacts for each of said devices and overlying each device's active area and the second stage comprising forming for each device a contact pad portion overlying an area of both the discrete contact and an adjacent semi-insulating isolated region such that removal of said regions separating said contact pattern conductors produces a hole through said isolated region through which said contact pad portion is exposed.

5. A method as in claim 3 or claim 4 wherein said regions of the high quality layer separating device active areas are isolated by bombardment of the layer with an ion beam at any stage following formation of at least one of said contact patterns, said conductors of the contact pattern lying across the beam path at the time of irradiation serving as a mask.

6. A method of fabricating a series connected combination of two-terminal semiconductor devices on a common substrate comprising
   fabricating a first precursor by the following procedure:
   forming a layer of high quality semiconductor material on the surface of a temporary substrate to provide active areas for the devices,
   forming first contact pattern conductors on the free surface of said high quality semiconductor layer to provide a separate first contact to this layer for each of the devices thereon,
   bonding an insulating support substrate overlayed by a conducting interconnection pattern to said first contact pattern so as to provide contact between said first and the interconnection patterns,
   removing said temporary substrate,
   forming second contact pattern conductors on the other surface of said high quality layer to provide a separate second contact to this layer for the devices thereon,
   at any stage after high quality semiconductor layer formation removing regions of this layer which separate a contact pattern's conductors so as to form isolated regions sandwiched between said first and second contact pattern conductors,
   fabricating a second precursor by the same procedure as that used for said first precursor, and bonding said first and second precursors together so as to provide contact between the second contact pattern of the one and the interconnection contact pattern of the other.

7. A method as in claim 6 wherein the removal of regions of said high quality semiconductor material layer is performed by etching mesas into this layer after formation of at least one of said patterns of contact conductors and using a pattern as an etch mask.

8. A method as in claim 6 or claim 7 wherein a layer of high quality semiconductor material is formed on the surface of a temporary substrate and divided into a first and a second portion for use in the first and second precursors, respectively.

9. A method as in claim 1 or claim 6 wherein said support substrate comprises a thermally conducting material.

10. A method as claimed in claim 1 or claim 6 wherein at least the region of said temporary substrate immediately adjacent to said high quality layer is removed by selective etching using an etchant which attacks said temporary substrate at a higher rate than said high quality layer.

11. A method as in claim 1 or claim 6 wherein said temporary substrate comprises a multi-layer semiconductor structure.

12. A method as in claim 11 wherein said temporary substrate comprises a semiconductor base layer with a semiconductor buffer layer formed on its surface upon which said high quality layer is epitaxially grown.

13. A method as in claim 12 wherein said base layer is removed by etching using an etchant which attacks this layer at a higher rate than said buffer layer and said buffer layer is removed by etching with an etchant which attacks said buffer layer at a higher rate than said high quality layer.

14. A method as in claim 12 wherein said temporary substrate comprises a base layer of GaAs, said buffer layer comprises GaAlAs, and said high quality layer comprises GaAs.

* * * * *